United States Patent [19]

Taylor, Jr.

[11] Patent Number: 4,668,603

[45] Date of Patent: May 26, 1987

[54] METHOD OF MAKING RAISED RELIEF CIRCUIT BOARD WITH SOLDERED CONNECTIONS HAVING NOMENCLATURE APPLIED THERETO

[75] Inventor: Harvey W. Taylor, Jr., Sayre, Pa.

[73] Assignee: E. I. Du Pont de Nemours and Company, Wilmington, Del.

[21] Appl. No.: 878,608

[22] Filed: Jun. 26, 1986

[51] Int. Cl.$^4$ .................................................. G03C 3/0
[52] U.S. Cl. ..................................... 430/258; 430/22; 430/253; 430/254; 430/315
[58] Field of Search ................. 430/22, 258, 253, 254, 430/272, 281, 315

[56] References Cited

U.S. PATENT DOCUMENTS

| | | | |
|---|---|---|---|
| 3,649,268 | 3/1972 | Chu et al. | 96/27 R |
| 4,282,308 | 8/1981 | Cohen et al. | 430/271 |
| 4,489,154 | 12/1984 | Taylor, Jr. | 430/253 |
| 4,572,886 | 2/1986 | Reid | 430/311 |
| 4,596,762 | 6/1986 | Gruner | 430/315 |

*Primary Examiner*—Jack P. Brammer

[57] ABSTRACT

Nomenclature is applied to a soldermask surface employing a peel apart film prior to application of molten solder.

7 Claims, No Drawings

METHOD OF MAKING RAISED RELIEF CIRCUIT BOARD WITH SOLDERED CONNECTIONS HAVING NOMENCLATURE APPLIED THERETO

BACKGROUND OF THE INVENTION

The present invention is directed to a process for applying nomenclature during formation of a printed circuit board which has a raised relief surface and which has soldered connections on a portion of electrical conductive paths or pad areas of the circuit board. Nomenclature refers to letters or symbols which, e.g., serve to identify a portion of the printed circuit board or serve to present certain information which is necessary or desirable to appear on the circuit board itself.

Nomenclature is conventionally applied in the manufacture of some circuit boards since identification or instruction which is legible on the board itself is desirable and in many instances essential. The current practice in the electronics industry is to employ ink screened films and a wet development step to apply such nomenclature to the surface of the printed circuit board. However the present invention relies upon dry film technology used in producing colored images on a substrate to provide this nomenclature in a process step immediately prior to application of molten solder to a circuit board protected by a solder-mask or nomenclature to which solder is not to adhere.

Chu et al. U.S. Pat. No. 3,649,268 discloses an image reproduction process using a photohardenable layer and a removable support involving the steps of lamination to a receptor, imagewise exposure to actinic radiation through the support to selectively raise the stick temperature of areas receiving the radiation, removal of the support, and application of a colored powder which adheres only to unexposed areas followed by repeating the above steps with another colorant.

Cohen et al. U.S. Pat. No. 4,282,308 discloses a dry film peel apart photosensitive element containing a strippable coversheet, a photoadherent layer and a tacky, nonphotosensitive contiguous layer receptive to colorant or particulate material and a support. The element is employed in color proofing in producing reversed toned or colored images and for duplicate colored images.

Taylor U.S. Pat. No. 4,489,154 discloses a process in preparing a surprint proof. A process is employed to apply different colored layers on a substrate to form a surprint proof employing a peel apart photosensitive element containing a strippable coversheet, a photoadherent layer containing a colorant, a tacky nonphotosensitive layer and a support. Exposure of the element through a separation negative and after separation the nonexposed from the exposed areas, a positive colored photoadherent image on the coversheet is adhered to a substrate or if exposed through a separation positive, a positive colored photoadherent image on the supported layer is adhered to a substrate. The process is repeated to form different colored layers on a substrate.

SUMMARY OF THE INVENTION

The present invention is directed to a process of forming nomenclature on a printed circuit board having a raised relief surface comprising the steps of
  (a) exposing through an image bearing transparency a peel-apart photosensitive element comprising in order from top to bottom, (1) a strippable coversheet comprised of a polymeric film which is transparent to actinic radiation, (2) a photoadherent layer containing a colorant and comprising a photohardenable material with ethylenically unsaturated or benzophenone type groups, (3) a nonphotosensitive organic contiguous layer, and (4) a sheet support, wherein, after exposure to actinic radiation, the peel force required to remove the coversheet (1) with the exposed photoadherent layer (2) thereon from the contiguous layer (3) is at least four times the peel force required to remove the coversheet (1) from an unexposed photoadherent layer (2);
  (b) peeling apart the exposed photosensitive element to form two elements: (i) coversheet bearing on its surface colored exposed image areas, and (ii) sheet support bearing the contiguous layer having on its surface complementary colored unexposed image areas;
  (c) adhering one of said elements (i) or (ii) to the surface of a substrate, the degree of adhesion to the photoadherent layer being greater than the adhesion of the photoadherent layer to the contiguous layer or the coversheet;
  (d) separating either the coversheet of element (i), or the sheet support and contiguous layer of element (ii);
wherein the improvement comprises the substrate is a printed circuit substrate containing a raised relief with areas which are electrically conductive and other areas which are electrically insulating wherein in step (c) said adhering is in register with the substrate and at least a portion of the conductive areas are on the surface of the substrate are not covered by the one of said elements (i) or (ii) and wherein the improvement contains the following steps subsequent to step (d):
  (e) curing the element (i) or (ii) which adheres to the surface of the substrate;
  (f) applying solder flux to the surface of the substrate;
  (g) applying molten solder to the fluxed substrate whereby electrically conductive areas have adherent areas of solder;
  (h) removing excess flux residue from the substrate.

DETAILED DESCRIPTION OF THE INVENTION

In formation of nomenclature such as letters or symbols on a printed circuit board the starting material for application of the nomenclature is a peel apart photosensitive element particularly adapted in preparation of a surprint proof containing a series of colored layers. Such starting material and its method of application is known in the prior art and is particularly disclosed in Taylor U.S. Pat. No. 4,489,159 incorporated by reference herein. However the present process differs from the disclosure of the patent in that only one colored layer is needed to obtain the nomenclature on a substrate as hereinafter defined as opposed to the surprint proof process of U.S. Pat. No. 4,489,154 wherein different colored layers are built upon a substrate to obtain a surprint proof containing several colors. Also a starting material suitable for use herein is commercially available as Cromacheck ® film.

In the present invention the starting substrate for application of a portion of the peel apart film is a circuit board which has a relief onto which a soldermask has been applied. Such substrate is an intermediate in making a soldered printed circuit board. The nomenclature will be on the surface of the substrate and needs to adhere to a portion of an underlying soldermask layer and yet withstand the conditions of applying molten solder to the entire surface of the substrate protected by the soldermask except in areas to which molten solder will adhere.

Formation of the starting substrate employed herein can be in accordance with conventional techniques in the art. Initially a printed circuit board is formed using a panel containing two copper layers separated by an insulating layer. Circuitry is preferably formed on both sides of the panel with an example of a suitable process disclosed in Celeste U.S. Pat. No. 3,469,982. In this patent a supported negative acting photosensitive film is laminated to a substrate and is imagewise exposed to actinic radiation. Thereafter unexposed layers are removed followed by permanently modifying the areas of the substrates which are protected by the exposed film by etching the substrate or by depositing a material onto the substrate. After such step the exposed material is removed to conventionally obtain a printed circuit board containing electrically conductive lines and insulating spaces. If nomenclature is applied to such substrate, satisfactory adhesion can be obtained. If a soldermask layer is applied, such layer will interfere with the visual effect of the nomenclature.

In the present invention a soldermask is first applied to the printed circuit board which contains a raised relief due to the conductive areas and nonconductive areas prior to application of the nomenclature. The application of the soldermask which is an insulating layer resistant to molten solder preferably is by a photosensitive soldermask film. An example of a negative acting soldermask layer is sold under the trademark Vacrel® soldermask film. A preferred application of the photosensitive film is in accordance with the teachings of Friel U.S. Pat. No. 4,127,436 employing vacuum lamination conditions. Thereafter the photosensitive soldermask film is imagewise exposed to actinic radiation with unexposed areas of the film washed away to expose portions of the substrate which are conductive. Thereafter a substrate surface typically is exposed to a molten wave of solder with solidification onto exposed conductive portions of the substrate without obtaining any adhering coating on the soldermask.

In the present invention the nomenclature is applied to the soldermask prior to the soldering step. It is surprising that the nomenclature can adhere to the soldermask to obtain a soldered printed circuit board with a surface containing nomenclature, soldermask and solder.

The element for applying nomenclature contains in order from top to bottom (1) a strippable coversheet comprised of a polymeric film which is transparent to actinic radiation (2) a photoadherent layer containing a colorant and comprising a photohardenable material with ethylenically unsaturated or benzophenone type groups, (3) a nonphotosensitive organic contiguous layer, and (4) a sheet support, wherein, after exposure to actinic radiation, the peel force required to remove the coversheet (1) with the exposed photoadherent layer (2) thereon from the contiguous layer (3) is at least four times the peel force required to remove the coversheet (1) from an unexposed photoadherent layer (2). The photoadherent layer, which is the sole photosensitive layer of the element, is one whose adhesive relationship between the coversheet and the contiguous layer is altered by exposure to actinic radiation, so that after exposure the exposed areas of the photoadherent layer adhere more strongly to the coversheet than to the contiguous layer and are removed with the coversheet while the unexposed areas of the photoadherent layer adhere more strongly to the tacky contiguous layer than to the coversheet.

Adhesive and cohesive force relationships of the layers are useful in characterizing the element wherein $A_1$ represents the adhesive force between the coversheet and the unexposed photoadherent layer $A_2$ represents the adhesive force between the unexposed photoadherent layer and the tacky contiguous layer, and C represents the cohesive value of the unexposed photoadherent layer (2). In the unexposed state $A_1$ is the lowest value, and the element will peel at the coversheet/photoadherent layer interface. The force relationship may be represented by:

$$C > A_1 << A_2.$$

It has been found that upon imagewise exposure of the element, dramatic changes occur in adhesive and cohesive values. $A_1^*$ represents the adhesive force between exposed areas of the photoadherent layer and the coversheet, $A_2^*$ represents the adhesive force between exposed areas and the tacky contiguous layer, and $C^*$ represents the cohesive value of the photoadherent layer in the exposed areas. Thus in the exposed state $A_2^*$ is the lowest value while the cohesive value C of the unexposed areas also must be sufficiently low to allow a clean break in the photoadherent layer at the interface between the exposed areas and unexposed areas (6) to allow exposed areas to be completely removed when the coversheet is peeled away. The resulting force relationship may be represented by:

$$C > A_1^* << A_2^* > C^*.$$

The combined effect of these cohesive and adhesive values is measured by the force required to peel or remove the coversheet at an angle of 180° from the surface of an element as a function of the amount of actinic exposure and the coversheet removal rate. Typically peel force in the exposed areas, $A_2^*$, is higher than in the unexposed areas, $A_1$, i.e., at least four times higher and preferably at least an order of magnitude difference. Upon exposure, following an induction period, photopolymerization or photoadhesion starts and peel force values increase rapidly with continued exposure. At intermediate exposures where polymerization of the photoadherent layer is insufficient the separation occurs at intermediate points in the photoadherent layer and does not give a good image. At the correct exposure level, however, the locus of failure shifts to the interface between the exposed photoadherent layer and the contiguous layer. The peel force at this point reaches a plateau and remains substantially constant over an extensive exposure range. Thus the ratio of adhesive forces for exposure to unexposed elements, i.e., $(A_2^*/A_1)$ is at least 4, and preferably between 10 and 100 or above.

The strippable coversheet of the element of the invention must be strippable (i.e., removable by peeling it apart) from the rest of the element, carrying with it only the exposed areas of the photoadherent layer. The coversheet is preferably oxygen impermeable and transparent to actinic radiation so that the element may be exposed through the coversheet. Preferred materials for the coversheet are polymeric films, particularly polyester films such as polyethylene terephthalate. Polyamide, polyimide, polystyrene, or polyolefin, e.g., polyethylene or polypropylene films may also be employed. In order to make the exposed areas of the photoadherent layer adhere better to the coversheet, the coversheet's surface may be modified; for example, the topography may be altered and the polarity increased by a surface treatment such as electrostatic discharge or flame treatment. In the case of a polyethylene terephthalate film having a thickness of 0.0005 inch (~0.013 mm), an electrostatic discharge of at least 0.025 coulomb/ft$^2$ (0.272 coulomb/m$^2$) and preferably about 0.07 coulomb/ft$^2$ 0.762 coulomb/m$^2$) is suitable. However, increased treatments may be used. Flame treatment of the film also will provide good photoadhesion. An air-propane flame may be used.

While the thickness of the coversheet may be varied over a wide range, films having a thickness of 0.001 inch (0.025 mm) or less are particularly preferred. Thin coversheets produce images with sharp edges. In addition, a rapid rate of coversheet strippability, e.g., up to 9,000 inches/minute (22,860 cm/minute) or higher, is obtainable with thin cover films. In general, a rapid rate of coversheet stripping produces better image quality. The coversheet should be thick enough so that electrostatic discharge or flame treatment will not injure it and so that it may be stripped without tearing. The coversheet may additionally comprise auxiliary treatments or layers to improve adhesion, strength, and other properties.

After imagewise exposure of the peel apart photosensitive element to actinic radiation, the exposed areas of the photoadherent layer adhere more strongly to the coversheet than to the contiguous layer in the exposed areas and more strongly to the contiguous layer than to the coversheet in the unexposed areas. Photohardenable materials are used for the photoadherent layer. Such materials are usually comprised of a material with ethylenically unsaturated or benzophenone-type group in which an increase in molecular weight and, consequently, an increase in adherent to the coversheet are caused by exposure to actinic radiation. The well-known photohardenable materials which are comprised of an ethylenically unsaturated material which is photopolymerizable, photocrosslinkable, photodimerizable or combinations thereof are preferred. Particularly preferred are photopolymerizable compositions comprised of a macromolecular organic polymer binder and an addition polymerizable ethylenically unsaturated monomer. The monomer has at least one and preferably two or more terminal ethylenically unsaturated groups capable of free-radical initiated, chain propagated addition polymerization, said monomer preferably having some degree of polarity and being compatible with the binder and with the polar surface of the coversheet, but substantially nondiffusible in the contiguous tonable layer. The photopolymerizable composition will also contain a free-radical generating addition polymerization photoinitiating system (i.e., at least one organic photoinitiator compound) activatable by actinic radiation, e.g., ultraviolet and visible radiation. Among acidic binders which have been found useful, there may be mentioned co(methyl methacrylate/methacrylic acid) and monoethyl ester of poly(methyl vinyl ether/maleic anhydride), each of which may be copolymerized in various proportions. Many other polar polymers and copolymers known in the art will be found useful as a binder in the photopolymerizable layer. The binder may be varied widely in its ratio with the monomer but in general it should be in the range of 3:1 to 1:3. The monomer should be compatible with, and may be a solvent for, and/or have a plasticizing action on the binder. The choice and proportions of monomer and binder are made in accordance with the requirements of selective photoadherence and hardness. In order to provide a suitable hardness, the monomer concentration is normally kept low so that the layer coated from the composition will be sufficiently hard and nontacky.

The contiguous layer may be chosen from a great number of materials. The contiguous layer is a nonphotosensitive tacky or slightly soft deformable organic material. For an element with good aging stability, suitable materials for the contiguous layer should restrain monomer diffusion from the photoadherent layer into the contiguous layer. Such materials may be selected from resins, polymers in which monomer of the photoadherent layer is substantially nondiffusible, adhesive compositions, etc. Particularly preferred materials are elastomeric polymers and mixtures thereof having a second order transition temperature of $-10°$ C. or lower which are inherently tacky or will accept tackifying agents and which are nonmigratory into said photoadherent layer and which will impart tackiness to the layer. Rubber type polymers, both natural and synthetic may be used, e.g., isobutylene, Thiokol A, nitrile rubbers, butyl rubber, chlorinated rubbers, polymers of butadiene, isoprene, poly(vinylisobutylether), and random, teleblock and block copolymers of butadiene or isoprene copolymerized with styrene, and neoprene, silicone elastomers, etc., in various proportions. With these materials, a stable adhesion balance between the photoadherent layer and a support for the contiguous layer.

For application of nomenclature to the surface of the soldermask the peel apart photosensitive element is exposed through an image bearing transparency followed by peeling apart the exposed photosensitive element to form two elements: (i) coversheet bearing on its surface colored exposed image areas, and (ii) sheet support bearing the contiguous layer having on its surface complementary colored unexposed image areas. Thereafter one said elements (i) or (ii) is adhered to the surface of the soldermask and the coversheet or support with contiguous layer is peeled away leaving nomenclature images adhered to the soldermask. Surprisingly either of these elements can be readily adhered to the surface of the soldermask. Generally heat and pressure will be employed which present no problem to the stability of these elements since they must withstand elevated temperature contact with molten solder. These conditions are not considered critical to obtain proper adherence. Illustratively lamination pressure of 20 psig and a temperature of 260° F. has been employed. After lamination, the laminate is allowed to cool and the coversheet or support is removed with a slow peel leaving behind nomenclature on the laminate surface.

As previously discussed, after application of the nomenclature molten solder is applied to the surface of the substrate to adhere solder to conductive areas. The nomenclature must have sufficient adherency to withstand the soldering conditions without separating from the soldermask. Typical soldering temperatures are in the range of from 450° to 550° F. for the molten solder.

General Fluxing Conditions

Prior to soldering, a flux is applied as a foam, wave, or by brushing to provide an even coat on the surface of the printed circuit board to be soldered. The flux cleans the metal surfaces to be soldered and reduces the surface tension of the solder to promote good bonding between the molten solder and the circuit board.

Since the flux normally contains ionic residues, it must be removed from the circuit board after soldering. This is accomplished by organic solvents for solvent fluxes and by detergent and water for the aqueous fluxes.

In the following examples all parts and percentages are by weight and degrees are in Fahrenheit unless otherwise indicated.

EXAMPLE 1

Nomenclature Applied To Printed Circuit Boards Without A Soldermask

Cromacheck® overlay color proofing film (black) was imaged with a negative phototool to give nomenclature on a 200 election discharge (ED) treated Mylar® polyester (negative image) after dry processing. In like manner, a positive phototool was used to provide nomenclature on the adhesive on 300A Mylar® polyester after processing (positive image).

The negative and positive images were applied to brush scrubbed (Chemcut) printed circuit boards bearing a Vacrel® soldermask test image. The printed circuit boards contained raised copper circuitry including pads on a glass epoxy substrate.

The negative image on 200 ED treated Mylar® polyester was laid over the printed circuit board and laminated on a Riston® hot roll laminator at 260° F. at a speed of 1 to 1½ feet per minute. The hot roll laminator has a pressure of about 20 psig.

After lamination, the board was allowed to cool and the 200 ED Mylar® polyester removed with a slow peel leaving behind the nomenclature on the glass epoxy substrate with copper circuitry. Nomenclature was not evident in areas where the lettering bridged the circuit lines and the glass epoxy substrate.

The same process was used to apply the positive image over the printed circuit boards with the same results. A higher peel force was encountered in removing the 300A Mylar® polyester with the adhesive; but, acceptable nomenclature was present.

The boards laminated with the positive image (unexposed Cromacheck®) were uniformly exposed to UV radiation on a Riston PC-24 printer. No additional exposures were given to the boards bearing the negative images (exposed Cromacheck®).

The boards were then divided into four classes (a-d) and subjected to a standard flux/solder float treatment:
  (a) Boards with the negative image given a standard UV exposure at 16 feet per minute in an Argus unit (1-2 J/cm$^2$) followed by a 300° F. bake for 1 hour and another UV cure in the Argus unit at 6 feet per minute (5 J/cm$^2$).
  (b) Boards with the negative image given none of the above post treatment.
  (c) Boards with the positive image given the UV exposure and bake above.
  (d) Boards with the positive image given none of the above post treatment.

Two different fluxes Alpha 809 (solvent based) and Alpha 709 (aqueous based) together with four different defluxing systems were carried out on the boards in the categories (a-d) above. The board was solder floated for 5 seconds at 525° F. followed by fluxing with Alpha 809 or 709. The board was solder floated again for 5 seconds at 525° F. After cooling to room temperature, boards fluxed with Alpha 809 were defluxed with each of the following:
  methylene chloride (soak for 8 minutes)
  20% isopropanol (by weight) in methyl chloroform
    3 minutes boiling
    3 minutes ambient temperature
    3 minutes vapors
  methyl chloroform
    3 minutes boiling
    3 minutes ambient temperature
    3 minutes vapors After cooling to room temperature, boards fluxed with Alpha 709 were defluxed with 5% trisodium phosphate (TSP) for 2 minutes at 150° F. with mild brushing.

The results obtained, when the prepared boards were subjected to the treatments described above, were:
  The positive and negative nomenclature on the boards in categories (b) and (d) above, in which no post UV cure or bake was performed did not acceptably survive the process when the solvent based flux (Alpha 809) was used. The flux attacked the nomenclature.
  The positive and negative nomenclature on the boards in categories (b) and (d), in which no post UV cure or bake was performed, survived the process when the aqueous based flux (Alpha 709) was used. The deflux treatment using TSP had no effect upon the nomenclature.
  The positive and negative nomenclature on the boards in categories (a) and (c) above, in which a post UV cure and bake was performed, survived all the fluxing, soldering and defluxing treatments with both Alpha 809 and 709. No damage was observed to the nomenclature in any of the aqueous or solvent based defluxing systems.

The results of the above treatment were that the nomenclature survived all of the fluxing, soldering and defluxing procedures described above on Vacrel® 930.

EXAMPLE 2

Nomenclature Applied To Printed Circuit Boards With Soldermask

Vacrel® 930 was vacuum laminated on a Soldermask Laminator (platen temperature-110° C., board exit temperature-145°-155° F., dwell time 55-60 seconds) to printed circuit boards that had been brush scrubbed. The boards were blanket exposed on a Riston® PC-24 printer for 40 seconds (510 mj/cm$^2$) to yield a Stouffer step 11 after development with methyl chloroform in a C-processor for 3 minutes (total travel time). Nomenclature from the negative image (200 ED treated Mylar®) of Chromacheck® was applied in the manner described under Example 1 to the soldermask. The boards were then subjected to the following treatment:
  UV cure in the Argus unit at 16 fpm (1-2 J/cm$^2$)
  Oven bake at 300° F. for 1 hour
  UV cure in the Argus unit at 6 fpm (5 J/cm$^2$)
  Solder floated 5 seconds at 525° F.
  Fluxed with Alpha 709 and 809
  Solder floated 5 seconds at 525° F.
  Allowed to cool to room temperature Defluxed with 5% TSP at 150° F. for 2 minutes with mild brushing when Alpha 709 was used When Alpha 809 was used, defluxed with methylene chloride (8 minute soak)

20% isopropanol in methyl chloroform (3 minutes each in boiling, ambient, vapors)

methyl chloroform (3 minutes each in boiling, ambient, vapors).

The results of the above treatment were that the nomenclature survived all of the fluxing, soldering and defluxing procedures described.

EXAMPLE 3

Nomenclature Applied To Printed Circuit Boards With Soldermask

Vacrel® 8030 soldermask was vacuum laminated to printed circuit boards with a soldermask vacuum laminator in a manner described under Example 2. After a ½ hour hold time, the boards were blanket exposed on a Riston® PC-24 printer for 36 sec (462 mj/cm$^2$). After another ½ hour hold time the boards were developed in ADS aqueous developer for 2 times the time to clean panel (total travel time −4 minutes) to yield a Stouffer step 11. Nomenclature from the negative image of Cromacheck® (200 ED treated Mylar®) was applied as described above to the printed circuit boards and the following treatment given:

UV cure Argus unit 6 fpm (5 J/cm$^2$)

1 hour bake at 300° F.

Solder float 5 seconds at 525° F.

Allowed to cool to room temperature

Defluxed with 5% TSP at 150° F. for 2 minutes with mild brushing when Alpha 709 was used.

The results were that the nomenclature survived the fluxing, soldering and defluxing treatment only when Alpha 709 (aqueous based) and TSP were used. The solvent based flux, Alpha 809, attacked the nomenclature and no defluxing with solvents was performed.

What is claimed is:

1. In a process comprising the steps of:

(a) exposing through an image bearing transparency a peel-apart photosensitive element comprising in order from top to bottom, (1) a strippable coversheet comprised of a polymeric film which is transparent to actinic radiation, (2) a photoadherent layer containing a colorant and comprising a photohardenable material with ethylenically unsaturated or benzophenone type groups, (3) a nonphotosensitive organic contiguous layer, and (4) a sheet support, wherein, after exposure to actinic radiation, the peel force required to remove the coversheet (1) with the exposed photoadherent layer (2) thereon from the contiguous layer (3) is at least four times the peel force required to remove the coversheet (1) from an unexposed photoadherent layer (2);

(b) peeling apart the exposed photosensitive element to form two elements: (i) coversheet bearing on its surface colored exposed image areas, and (ii) sheet support bearing the contiguous layer having on its surface complementary colored unexposed image areas;

(c) adhering one of said elements (i) or (ii) to the surface of a substrate, the degree of adhesion to the photoadherent layer being greater than the adhesion of the photoadherent layer to the contiguous layer or the coversheet;

(d) separating either the coversheet of element (i), or the sheet support and contiguous layer of element (ii);

wherein the improvement comprises the substrate is a printed circuit substrate containing a raised relief with areas which are electrically conductive and other areas which are electively insulating wherein in step (c) said adhering is in register with the substrate and at least a portion of the conductive areas are on the surface of the substrate are not covered by the one of said elements (i) or (ii) and wherein the improvement contains the following steps subsequent to step (d):

(e) curing the element (i) or (ii) which adheres to the surface of the substrate;

(f) applying solder flux to the surface of the substrate;

(g) applying molten solder to the fluxed substrate whereby electrically conductive areas have adherent areas of solder;

(h) removing excess flux residue from the substrate.

2. The process of claim 1 wherein a permanent coating is on at least a portion of the substrate containing electrically conductive areas and insulative areas.

3. The process of claim 2 wherein said permanent coating is a soldermask.

4. The process of claim 1 wherein step (c) of adhering and step (d) of curing are concurrent.

5. The process of claim 3 wherein step (c) of adhering and step (d) of curing are concurrent.

6. A process according to claim 1 wherein in step (a) the peel apart element is exposed through a negative transparency; in step (c) element (i) is adhered to the surface of the substrate; and in step (d) the coversheet of element (i) is separated.

7. A process according to claim 1 wherein in step (a) the peel apart element is exposed through a positive transparency; in step (c) element (ii) is adhered to the surface of the substrate; and in step (d) the sheet support and contiguous layer are separated.

* * * * *